(12) United States Patent
Franco (10) Patent No.: US 8,164,906 B2
(45) Date of Patent: Apr. 24, 2012

(54) MODULAR ELECTRONIC ENCLOSURE

(76) Inventor: Michael John Franco, Madison, WI (US)

( * ) Notice: Subject to any disclaimer, the term of this patent is extended or adjusted under 35 U.S.C. 154(b) by 855 days.

(21) Appl. No.: 11/807,935

(22) Filed: May 29, 2007

(65) Prior Publication Data

US 2008/0298014 A1 Dec. 4, 2008

(51) Int. Cl.
*H05K 7/16* (2006.01)
(52) U.S. Cl. ......... 361/727; 361/788; 361/731; 361/729
(58) Field of Classification Search .................. 361/788, 361/727, 731, 729
See application file for complete search history.

(56) References Cited

U.S. PATENT DOCUMENTS

| | | | |
|---|---|---|---|
| 5,751,549 A | 5/1998 | Eberhardt et al. | |
| 6,166,917 A | 12/2000 | Anderson | |
| 6,189,133 B1 * | 2/2001 | Durham et al. | 716/12 |
| 6,195,262 B1 | 2/2001 | Bodette | |
| 6,283,778 B1 | 9/2001 | Kupnicki | |
| 6,762,939 B2 | 7/2004 | Summers | |
| 6,906,914 B2 | 6/2005 | Stamos | |
| 6,910,267 B1 | 6/2005 | Erwin | |
| 6,935,868 B1 * | 8/2005 | Campini et al. | 439/67 |
| 6,983,385 B2 | 1/2006 | German | |
| 7,042,734 B2 | 5/2006 | Hensley | |
| 7,062,578 B2 | 6/2006 | Davies | |
| 7,167,380 B2 | 1/2007 | Ice | |
| 7,209,351 B2 | 4/2007 | Wei | |
| 7,486,526 B1 * | 2/2009 | Frangioso et al. | 361/788 |
| 2002/0006026 A1 * | 1/2002 | Takahashi et al. | 361/687 |
| 2003/0235042 A1 | 12/2003 | Harris | |
| 2004/0130868 A1 * | 7/2004 | Schwartz et al. | 361/687 |
| 2005/0048805 A1 | 3/2005 | Budny | |
| 2005/0219833 A1 | 10/2005 | Wu et al. | |
| 2006/0206647 A1 | 9/2006 | Stahl | |
| 2006/0223343 A1 * | 10/2006 | Campini et al. | 439/64 |
| 2006/0280196 A1 * | 12/2006 | Overgaard | 370/425 |

(Continued)

OTHER PUBLICATIONS

Pages from Elma Internet website for 1U CPCI products, earliest publication date found Oct. 20, 2003, Internet address http://www.elma.com/Americas/English/products.

(Continued)

*Primary Examiner* — Tuan T Dinh
*Assistant Examiner* — Steven Sawyer
(74) *Attorney, Agent, or Firm* — Phillip M. Wagner (57) ABSTRACT

A modular electronic enclosure having a maximum height of 1 U and a width adapted to fit between the rails of a 19 inch rack is adapted to receive up to ten single-width Advanced Mezzanine Cards (AMCs) installed horizontally in the enclosure. Some modules that are not compliant with AMC standards may be installed in the modular electronic enclosure. A backplane, backplane structural support, combined card guide, chassis cover, and chassis bottom cooperate mechanically to provide a stiff, stable enclosure resistant to mechanical flexure. The modular electronic enclosure includes two hot-swappable cooling units which cooperate to establish push-pull cooling airflow. The modular electronic enclosure is further adapted to receive a Power Unit and an MCH. In another embodiment, the modular electronic enclosure includes a backplane with more than one core and has mounting locations and electrical connectors for up to twenty single-width 4 HP electronic modules. A backplane having more than one core is included in some embodiments. In some embodiments, the modular electronic enclosure is adapted to receive a combination of electronic modules comprising single-width, dual-width, and quad-width electronic modules. Some embodiments optionally include an MCH, a power unit module, or a J-TAG Switch module, or combinations of these and other modules.

16 Claims, 7 Drawing Sheets

U.S. PATENT DOCUMENTS

2007/0121306 A1* 5/2007 Moakes et al. .............. 361/788
2007/0242423 A1 10/2007 Joist et al.
2008/0037218 A1* 2/2008 Sharma et al. .............. 361/695

OTHER PUBLICATIONS

Press announcement from CorEdge Networks, "CorEdge Networks Demonstrates Industry'S First PicoTCA Test and Development Systems", Jun. 4, 2006.

Pages from CorEdge Networks Internet website for PicoTCA products, earliest publication date found Jun. 4, 2006, Intenet address http://www.coredgenetworks.com/picotca/pico_1us.html.

Pages from ABMX.com Internet website for 1U rack-mount mini-server, earliest publication date found Jun. 23, 2003, Internet address http://www.abmx.com "Micro Telecommunications Computing Architecture Short Form Specification", published by PICMG, Sep. 21, 2006.

Pages from Comtel Internet website for 1U CPCI products, earliest publication date unknown but no later than Feb. 2, 2008, Internet address: http://www.comtel-online.de/eng/products.php?actions=list&id=40.

Page from Internet webcast hosted by Open Systems Publishing on May 17, 2007, title "MicroBox—A Sneak Peek", page authored by Michael Franco (applicant).

PCT International Search Report, International Application No. PCT/US2010/036592, date of mailing Jan. 5, 2011.

PCT Written Opinion of the International Searching Authority, International Application No. PCT/US2010/036592, date of mailing Jan. 5, 2011.

* cited by examiner

MODULAR ELECTRONIC ENCLOSURE

FIELD OF THE INVENTION

The present disclosure relates generally to computer and telecommunications equipment and more specifically to a modular electronic enclosure adapted for operation of Advanced Mezzanine Cards.

BACKGROUND

Manufacturers and users of telecommunications equipment, networking equipment, computer systems, and other types of electronic systems comprising computing and communications functions have proposed several non-proprietary standards to reduce costs, reduce time to market, and improve performance. The dissemination and use of such non-proprietary standards, also known as open architecture standards, is believed to improve interoperability and increase reliability in products compliant with those standards. Open architecture standards for telecommunications and computing equipment may include, for example, mechanical dimensions of enclosures, racks, and electronic modules, power dissipation limits, and thermal management schemes. Open architecture standards may also include definitions of communications and control signals to be exchanged between functional elements inside a system and between the system and the outside world, electrical connector styles and pin assignments, operating voltages and currents, software commands, and data formats.

Some examples of open architecture standards for telecommunications, networking, and computer equipment include Advanced Telecommunications Computing Architecture, Advanced Mezzanine Card, and Micro Telecommunications Computing Architecture. Advanced Telecommunictions Computing Architecture, also known as ATCA and AdvancedTCA, comprises an open architecture for high-performance, high-reliability telecommunications modules. More than one AdvancedTCA module may be mechanically and electrically connected to an enclosure known in the art as a telecom shelf. A telecom shelf may have an open-frame chassis or be partially or fully enclosed. Each telecom shelf is further adapted for attachment to an equipment rack. Equipment racks having a width of 19 inches (482.6 mm) are most common, but racks with other widths are also used. More than one telecom shelf may be connected to a rack, and the rack may further be located inside a cabinet to aid in thermal management, provide electrical shielding, and provide mechanical protection. A large system may comprise more than one rack, cabinet, or a combination of racks and cabinets.

A height measurement for an AdvancedTCA module is 14.0 inches (355.6 mm), known in the art as a height of 8 U. The 8 U designation is in reference to widely recognized conventions for describing a panel height for rack-mounted equipment, wherein a height increment of 1 U corresponds to 1.75 inches (44.5 mm). The relatively large size of an AdvancedTCA module enables many complex functions to be incorporated into a single module, making AdvancedTCA an attractive solution for large, high performance systems.

One type of AdvancedTCA module is a carrier board, also known as an ATCA carrier. An ATCA carrier couples functional modules to AdvancedTCA infrastructure services such as power, ground, timing signals, data and command buses, status signals, error signals, and other input and output signals. A type of functional module designed to operate with an ATCA carrier is known as an Advanced Mezzanine Card. Advanced Mezzanine Cards, also referred to as Advanced-MCs or AMCs, comply with mechanical, electrical, power, software, and other requirements in the AdvancedTCA standard.

Up to eight AdvancedMCs may be connected to an ATCA carrier. An AdvancedMC may be connected to or disconnected from an ATCA carrier without turning off power to other modules on the carrier, a feature known in the art as hot-swapping. Hot-swapping enables maintenance to be performed on one AdvancedMC without removing other AdvancedMCs from service. AdvancedMCs help improve the overall reliability of an ATCA system because a failure in a single module will not cause the entire system to fail. Furthermore, uninterrupted system availability, a measure of system reliability, may be increased by installing as many redundant AdvancedMCs as are needed to have a desired confidence level that a preferred minimum number of AdvancedMCs is always in operation. Also, by adding or removing AdvancedMCs from a system, performance attributes such as storage capacity or rate of data transfer may be readily scaled up or down to address changes in application requirements.

While AdvancedTCA telecom shelves are well-suited for many large-scale applications, they may be too large and expensive for some applications. Another open architecture standard called Micro Telecommunications Computing Architecture, also known as MicroTCA, connects the same types of AdvancedMCs compatible with AdvancedTCA to a backplane, thereby eliminating ATCA carrier modules and enabling size and cost reductions compared to AdvancedTCA. A first version of a MicroTCA standard was released by the Compact PCI Industrial Computer Manufacturers Group (PICMG) in July 2006.

A MicroTCA system comprises at least one AdvancedMC, at least one MicroTCA Carrier Hub (MCH), and the interconnect, power, cooling, and mechanical infrastructure to support them. MicroTCA systems may vary in size from small, stand-alone enclosures comprising a small number of AdvancedMCs to installations including multiple telecom shelves with hundreds of cards. MicroTCA systems are well suited to, but are not limited to, applications requiring a smaller enclosure or applications that may operate with a lower reliability target than is generally offered by an ATCA system. Examples of MicroTCA applications include wireless Internet access points, medical instrumentation, industrial monitoring and control, digital imaging, and enterprise applications.

The MicroTCA standard recommends a height range of 2 U to 6 U (3.5 inches to 10.5 inches) (88.9 mm to 266.7 mm) for a MicroTCA telecom shelf to be mounted in a rack. Modules having a height of about 0.5 inch (14 mm) are referred to as 3 HP or alternatively as half-height. Modules having a height of about 0.7 inch (19 mm) are referred to as 4 HP or alternatively mid-size. Modules having a height of about 1.1 inch (29 mm) are referred to as 6 HP or alternatively full-size. Modules having a width of approximately 2.9 inch (74 mm) are referred to as single-width. A module with about twice the width of a single module is referred to as having double-width and one with about four times the width of a single module is referred to as having quad-width. Full-size, mid-size, and half-height modules may alternatively be made with single-width, double-width, or quad-width.

Previously, the smallest rack-mountable MicroTCA enclosure had a height of 2 U and was limited to two 6 HP AdvancedMCs. An enclosure having a height of approximately 1 U is also known in the art, but it is not rack-mountable and is limited to two 6 HP AdvancedMCs. For applications needing more than two AdvancedMCs in a rack-mountable enclosure, the solution was to use a relatively large enclosure, thereby increasing the size and cost of the finished system. Furthermore, reductions in the size of structural elements, backplanes, connectors, and other components used in enclosures having a height of 2 U or more was expected to result in rack-mountable enclosures smaller than 2 U having insufficient mechanical strength, thereby leading to reduced reliability. What is needed is a MicroTCA enclosure system that can be mounted in a 19 inch rack, holds up to ten single-width 4 HP electronic modules having a size comparable to AMCs in an enclosure having a height of 1 U, is able to operate with some electronic modules that are not fully compliant with AdvancedMC standards, and includes all necessary infrastructure for power, cooling, monitoring, and input/output, and giving adequate mechanical support to all components.

SUMMARY

In one embodiment, a modular electronic enclosure has a height of 1 U. The modular electronic enclosure has a width and mounting features adapted for attachment to a 19 inch rack and has a depth adapted to contain a 4 HP single-width electronic module having a size comparable to an AdvancedMC. The modular electronic enclosure comprises a rear surface comprising a backplane structural support, a chassis cover connected to a top surface of the backplane structural support, and a chassis bottom connected to a bottom surface of the backplane structural support. The chassis cover is formed into an enclosure top, an enclosure right side, and an enclosure left side, wherein the enclosure right side and enclosure left side are parallel to each other and at right angles to the enclosure top. A plurality of perforations formed in the chassis cover right side and the chassis cover left side enable air to flow into and out of the interior of the modular electronic enclosure.

In some embodiments, a backplane is attached to an inner surface of the backplane structural support. A sufficient number of connectors are installed on a large surface of the backplane facing the interior of the enclosure to enable connection of up to ten single-width AMCs. Optionally, some electronic modules which are not fully compliant with AdvancedMC specifications may be installed in the modular electronic enclosure and may be connected to the backplane, for example, an electronic module which is a power unit or an electronic module which is a J-TAG switch module. The backplane also provides hot-swappable electrical connections to a first cooling unit near one end of the backplane and a second cooling unit near an opposite end of the backplane. The backplane further provides electrical and mechanical connections for an MCH. In some embodiments, some connectors attached to the backplane are compression-type connectors.

A plurality of combined card guides is provided to align connectors on mid-size AdvancedMCs with corresponding connectors on the backplane. A combined card guide has a height adapted to fit between an inner surface of the chassis cover and an inner surface of the chassis bottom and is formed with two parallel channels along a length of the guide to provide support for two AdvancedMCs or similar electronic modules, one above the other. In some embodiments, a combined card guide has one channel and provides support for a single electronic module. Support surfaces along a top edge and a bottom edge of a combined card guide are connected to the chassis cover and chassis bottom with threaded fasteners. The combination comprising the chassis cover, chassis bottom, backplane structural support, and combined card guides cooperate to provide a stiff, stable mechanical structure. In other embodiments, a number and location of single-channel and two-channel combined card guides are selected to enable installation of double-width AdvancedMCs or similar electronic modules. In other embodiments, a number and location of single-channel and two-channel combined card guides are selected to enable installation of quad-width electronic modules.

The first and second cooling units are adapted for hot-swapping and cooperate in a push-pull cooling arrangement to cool the interior of the modular electronic enclosure. At least one filter is provided adjacent to a cooling unit to remove large particles entrained in air flowing into the enclosure. A cooling unit comprises four axial-flow fans mounted side by side in a tray connected to a front panel having a handle and lighted cooling unit status indicators.

In another embodiment, a multiple-core backplane is adapted for connection of up to ten AdvancedMCs on each side of the backplane. The multiple-core backplane has a thickness chosen to provide a sufficient number of layers for the number of interconnections to be made. Additional combined card guides are coupled to the backplane, the chassis cover, and the chassis bottom to enable AdvancedMCs to enter the enclosure from the front or the back, thereby providing connections and mounting locations for up to twenty 4 HP single-width AdvancedMCs in a 1 U modular electronic enclosure. In other embodiments, a backplane may have more than two cores.

This section summarizes some features of the present embodiment. These and other features, aspects, and advantages of the embodiments of the invention will become better understood with regard to the following description and upon reference to the following drawings, wherein:

DESCRIPTION

Embodiments of the invention include a modular electronic enclosure having a height of 1 U and adapted to operate with electronic modules having a size, an electrical interface, and a power requirement compatible with an AdvancedMC. Some electronic modules that are not compatible with AdvancedMC standards may optionally be installed in the modular electronic enclosure. In an embodiment shown in FIG. 1, a modular electronic enclosure 1 comprises a chassis cover 2, a chassis bottom 3, two cooling units 4, six combined card guides 5, and a pair of rack mounting flanges 6. An open side of the modular electronic enclosure 1 through which several card guides 5 are visible is referred to herein as the front of the enclosure. The modular electronic enclosure 1 has a width adapted to fit between the rails of a 19-inch (482.6 mm) rack. Two rack mounting flanges 6, one on either side of the chassis, enable attachment of the modular electronic enclosure 1 to the rails of a rack. In other embodiments, the modular electronic enclosure 1 has a width adapted to fit other rack sizes. The modular electronic enclosure 1 has a depth adapted to contain a 4 HP single-height AdvancedMC, a backplane, and related mechanical elements. In one embodiment, the modular electronic enclosure has a depth of 7.87 inches (200 mm).

Figure 1:
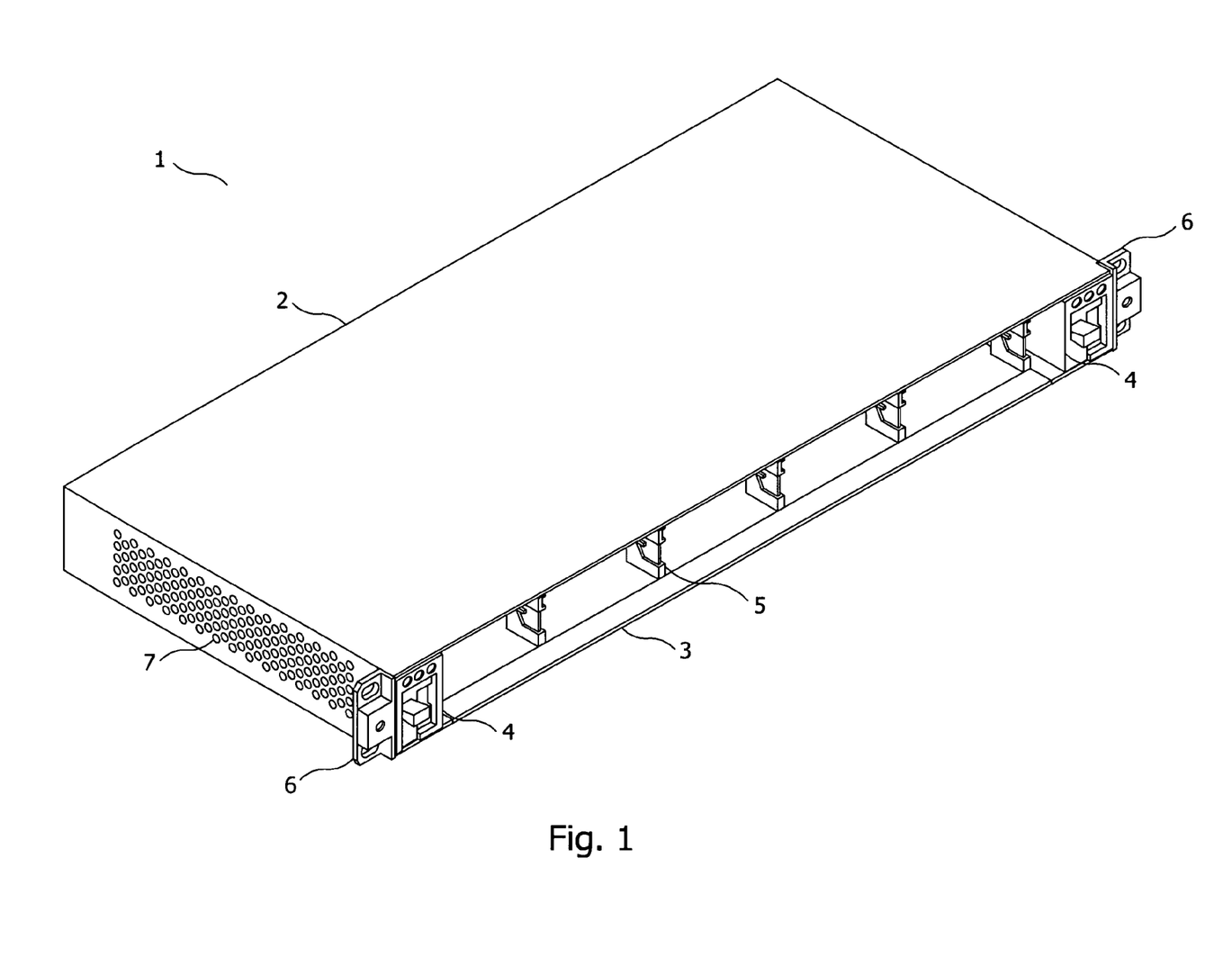
FIG. 1 is an isometric view of the front, top, and left side of a modular electronic enclosure having a height of 1 U.

The chassis cover 2 is formed into an enclosure top, an enclosure right side, and an enclosure left side, wherein the enclosure right side and enclosure left side are parallel to each other and at right angles to the enclosure top. A plurality of perforations formed in the chassis cover right side and the chassis cover left side enable air to flow into and out of the interior of the modular electronic enclosure 1. A first mounting bracket 6 connected to the enclosure left side near the front of the enclosure and a second mounting bracket 6 connected to the enclosure right side near the front enable attachment of the modular electronic enclosure 1 to the rails of an equipment rack.

Figure 2:
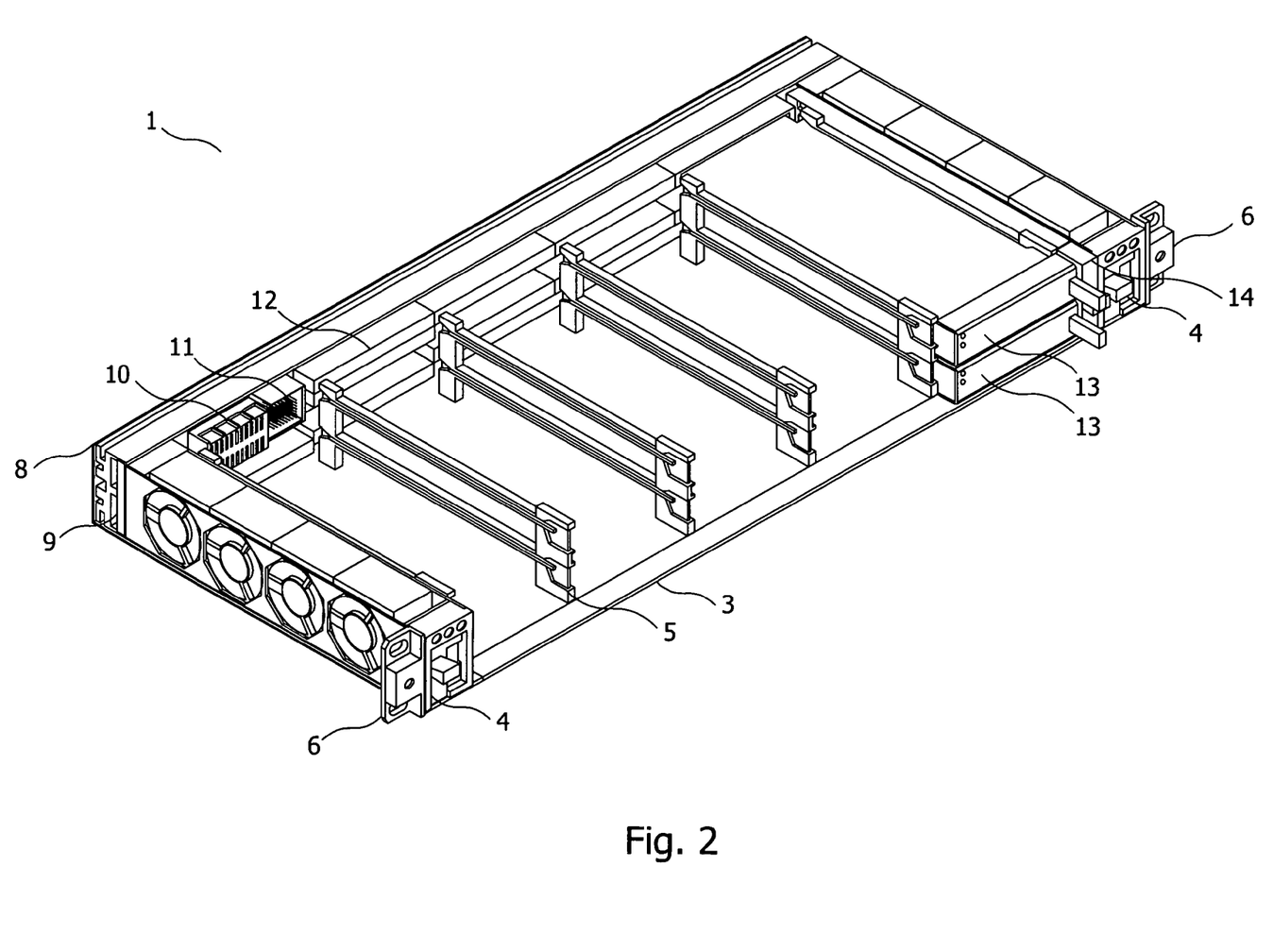
FIG. 2 is an isometric view of the enclosure of FIG. 1 with the chassis cover removed and further showing an example installation of two 4 HP AdvancedMCs and an MCH.

The embodiment of FIG. 1 is shown with the chassis cover 2 removed in FIG. 2, thereby exposing components located in the interior of the enclosure. A cooling unit 4 comprises four axial-flow fans and a front panel coupled to a metal tray that slides into the enclosure 1. The cooling unit 4 is adapted to be hot-swappable. In other embodiments, a different number and type of fans may be used. The front panel of the cooling unit 4 includes lighted indicators to visually indicate the operating status of the cooling unit 4. A handle on the front panel of the cooling unit 4 is connected to a latching mechanism inside the cooling unit that helps retain the cooling unit 4 into the enclosure 1. The cooling unit is connected at a back surface to a backplane 9. Power is supplied to the cooling unit and status and monitoring signals pass between the cooling unit and an MCH 14, through the backplane 9 connection.

The combined card guides 5, six of which are shown in FIG. 2, provide structural support to the modular electronic enclosure 1 and facilitate proper alignment and retention of AdvancedMCs installed in the enclosure. Some combined card guides 5 have one mounting channel for an electronic module and some card guides 5 have two parallel mounting channels for two electronic modules, coupled to the combined card guide 5 one above another with a sliding fit in the mounting channel. The combined card guides 5 are attached to the chassis bottom 3 with threaded fasteners. The combined card guides 5 are also connected to the chassis cover 2 with threaded fasteners when the chassis cover 2 is in place. A distance separating two adjacent combined card guides 5 is chosen to enable a single-width AdvancedMC or an electronic module having a similar size to fit between the card guides 5 and couple with a sliding fit into channels formed in the card guides 5. In other embodiments, a number and location of single-channel and two-channel combined card guides 5 are selected to enable installation of double-width electronic modules. In other embodiments, a number and location of single-channel and two-channel combined card guides are selected to enable installation of quad-width electronic modules or alternatively, combinations of single-width, double-width, and quad-width electronic modules. The combined card guides 5 are further positioned so as to align electrical connectors included as part of an electronic module to be installed in the modular electronic enclosure with corresponding electrical connectors (10, 11, 12) attached to a surface of a backplane 9. A card guide 5 also includes attachment points to which a latching mechanism included with an electronic module connects when the electronic module is installed in the modular electronic enclosure 1.

An example of an MCH 14 installed in the modular electronic enclosure 1 is shown in FIG. 2. The MCH 14 is adjacent to a cooling unit 14 near the right side of the modular electronic enclosure 1. The MCH 14 is connected to the backplane 9 and exchanges control, data, and status signals with other parts of the modular electronic enclosure 1, with other electronic modules installed in the enclosure 1, and with external systems.

An example installation of electronic modules is shown in FIG. 2. Two electronic modules 13 having a size comparable to a 4 HP single-width AMC are coupled to combined card guides 5 near the right side of the modular electronic enclosure 1. A bar protruding from a face plate on an electronic module 13 in FIG. 2 represents an ejection and latching mechanism that couples an electronic module 13 to a combined card guide 5 and disconnects electronic module 13 from the backplane 9 when removal of the electronic module 13 from the enclosure is desired. As can be seen in FIG. 2, positions for up to ten single-width 4 HP electronic modules are provided in the enclosure embodiment described.

Figure 3:
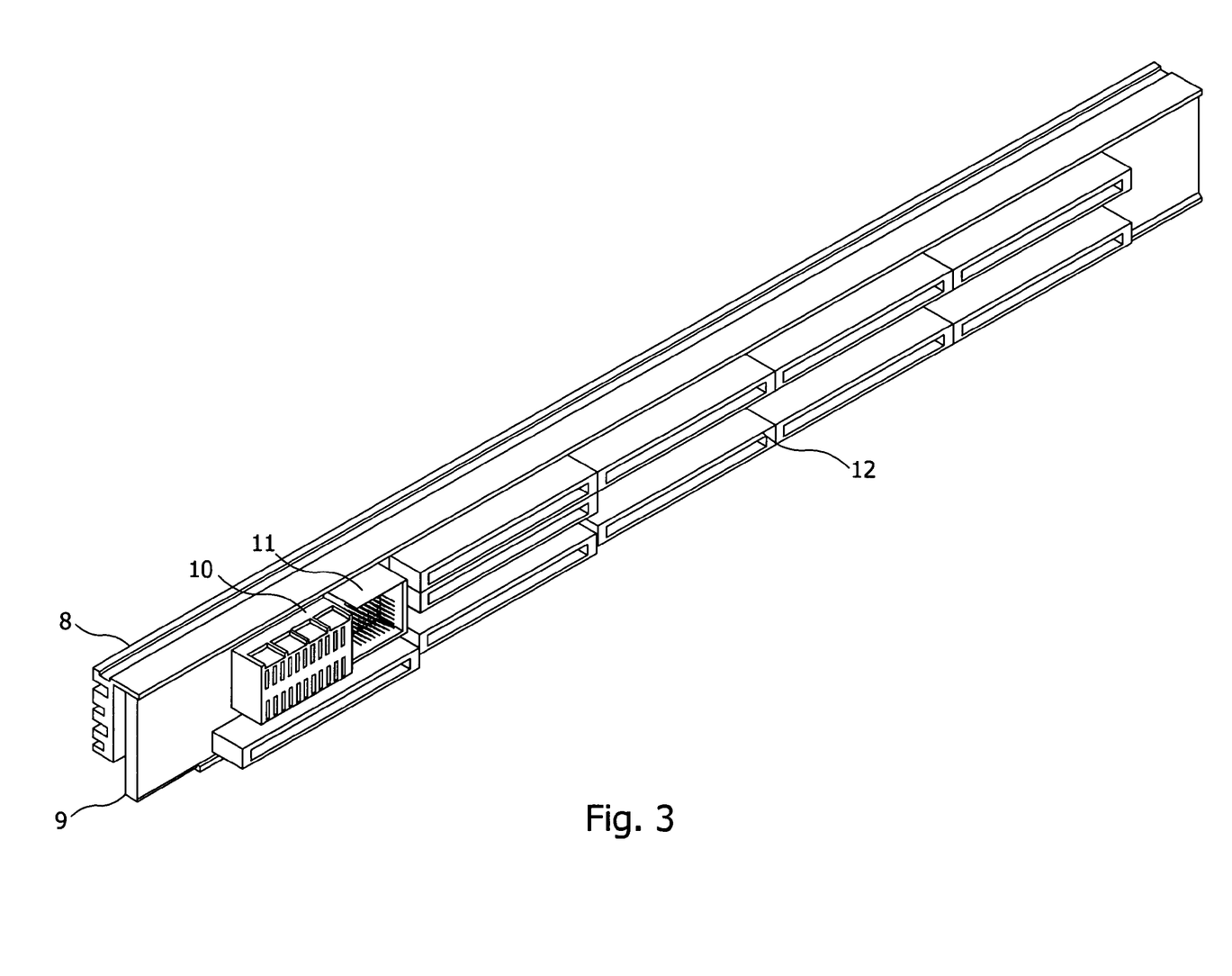
FIG. 3 is an isometric view of a backplane and backplane structural support for the embodiment of FIG. 1.

A back surface of the modular electronic enclosure embodiment of FIG. 1 and FIG. 2 comprises a backplane structural support 8. The backplane structural support 8 is also shown in FIG. 3. In the illustrated embodiment, the backplane structural support 8 is formed from extruded aluminum alloy. In other embodiments, the backplane structural support 8 is formed from machined or bent steel alloy or aluminum alloy. The backplane structural support 8 is formed with apertures and channels to engage with mechanical fasteners used to connect the backplane structural support 8 to the backplane 9, the chassis bottom 3, the chassis cover 2 (shown in FIG. 1), and support brackets for the cooling units 4. The backplane structural support 8 cooperates with the chassis cover 2, chassis bottom 3, combined card guides 5, and support brackets for the cooling units 4 to form a stiff, stable mechanical structure for the modular electronic enclosure 1.

Figure 9:
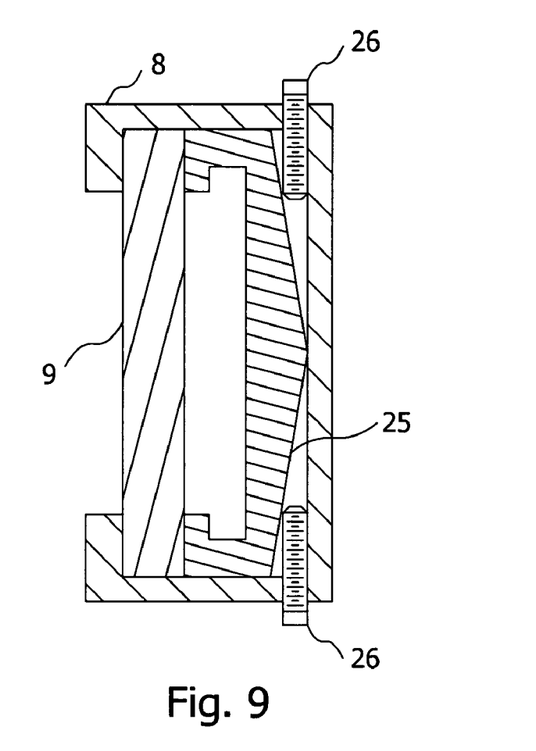
FIG. 9 is a partial sectional view of an embodiment of a backplane structural support.

In some embodiments, the backplane structural support includes an adjustable element to provide firm mounting of backplanes that may have variations in a thickness dimension. Such variation may occur, for example, when the number of layers in a backplane is changed. FIG. 9 illustrates a cross-sectional view of a backplane structural support 8 having a movable backplane clamp 25 in contact with a surface of a backplane 9 and a surface of the backplane structural support 8. A plurality of threaded fasteners 26 passing through threaded holes formed in the backplane structural support 8 apply an adjustable amount of pressure to an angled surface of the backplane clamp 25, thereby moving the backplane clamp 25 until it comes into contact with a surface of the backplane 9 and holding the backplane 9 firmly against the backplane structural support 8. This configuration has the advantage of providing a fixed positional reference for an outer surface of the backplane 9, that is, a surface of the backplane 9 upon which connectors are attached, where such positional reference is not dependent on a thickness dimension of the backplane 9.

Figure 4:
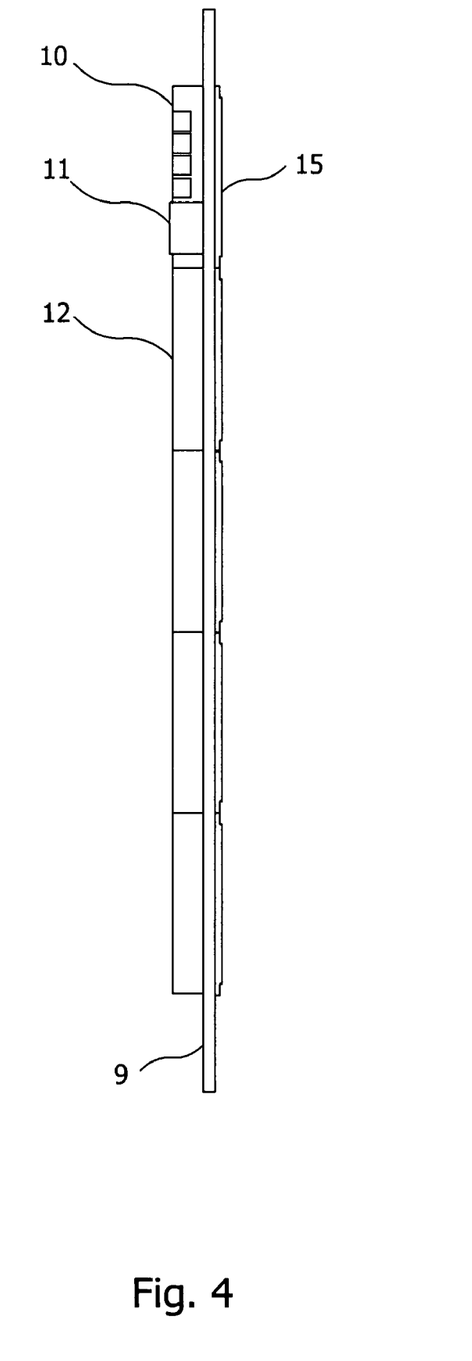
FIG. 4 is top view (rotated 90 degrees) of the backplane of FIG. 3.
Figure 5:
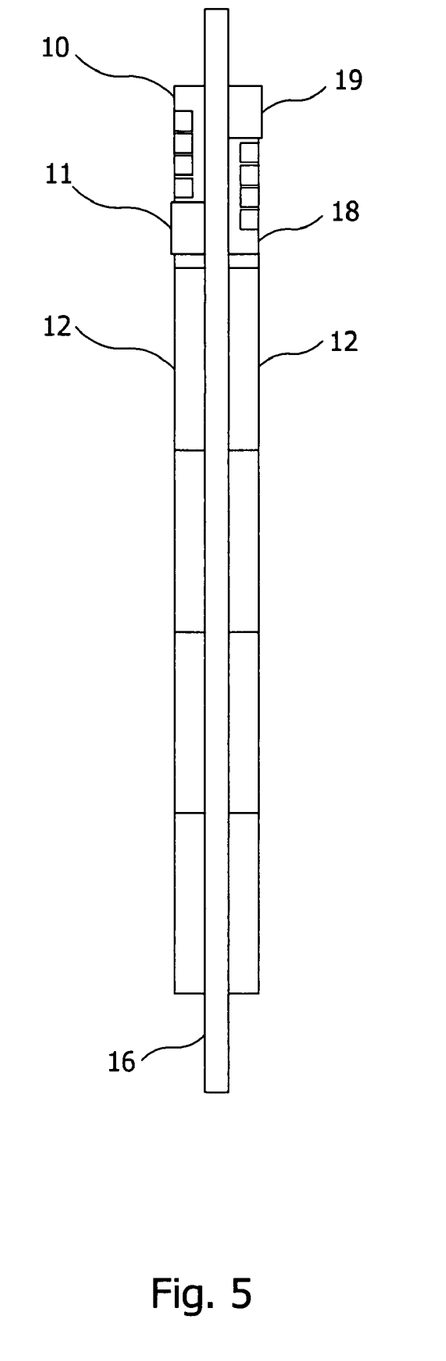
FIG. 5 is a top view of an example of a backplane having more than one core.

Power and other electrical signals pass between components in the modular electronic enclosure 1 through the backplane 9. Timing, data, command, status, and other signals also pass between electronic modules and an MCH installed in the enclosure through the backplane 9. The backplane 9 is shown attached to the backplane structural support 8 in FIG. 2 and FIG. 3. A top view of the backplane 9 and backplane structural support 8 from FIG. 3 is shown in FIG. 4. Connectors attached to the backplane 9 enable connection of up to ten single-width 4 HP electronic modules. A first power connector 10 and a second power connector 11 located near an end of the backplane 9 are provided for connection of an AdvancedMC Power Unit. In a location adjacent to the power connector 12, two mating connectors for an edge connector 12 are attached to the backplane 9, one immediately above the other. In other locations, a single mating connector for an edge connector 12 is provided for connection to an electronic module. In the embodiment shown in FIG. 4, a connector backing plate 15 is installed behind each connector on the backplane 9 to provide additional stiffness to the backplane 9. In other embodiments, the connector backing plate 15 may be omitted.

In the embodiment shown in FIG. 2, FIG. 3, and FIG. 4, the first power connector 10 and the second power connector 11 are shown as separate connectors. In other embodiments, the functions of the first power connector 10 and the second power connector 11 are combined into a single connector. Also, in other embodiments the order and arrangement of power connectors (10, 11), mating connectors for an edge connector 12, and connectors for MCH 14 and cooling units 4 are changed to provide for a different arrangement of AdvancedMCs, electronic modules, MCH, and cooling units. In some embodiments, some of the connectors are compression-type connectors.

Figure 6:
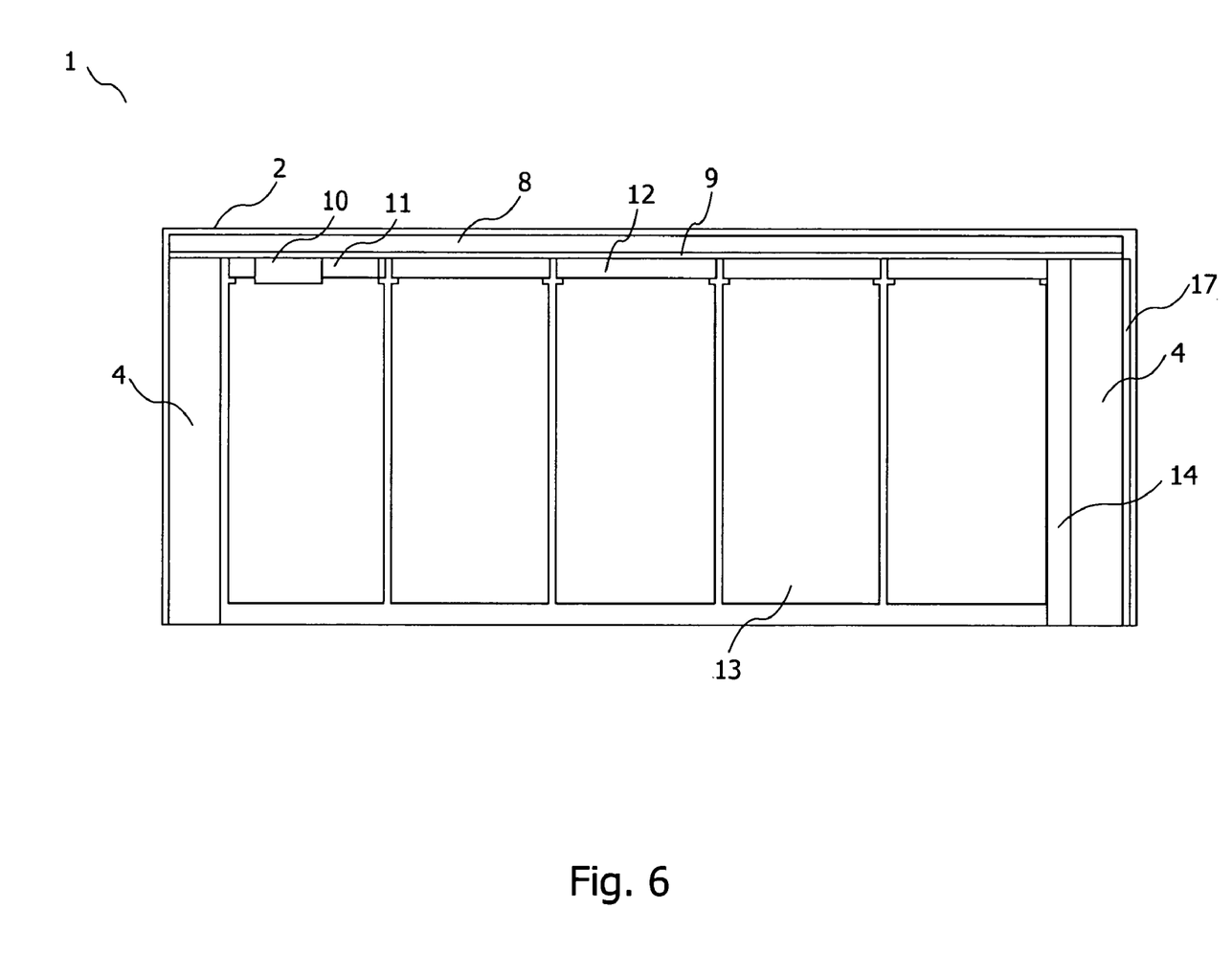
FIG. 6 is a simplified top view of the embodiment of FIG. 1, showing a row of five electronic modules installed in the modular electronic enclosure.

A simplified top view of the embodiment of FIG. 1 is shown in FIG. 6. FIG. 6 illustrates five single-width electronic modules 13 next to each other inside the modular electronic enclosure 1. A second row of five electronic modules may be installed below the row visible in the figure. The relative positions of the chassis cover 2, backplane support 8, backplane 9, cooling units 4, power connectors (10, 11), mating connectors for an edge connector 12, and MCH 14 are also indicated. A position for an air filter 17 is shown next to a cooling unit 4. The air filter 17 prevents large solid particles entrained in air from being drawn into the enclosure.

Figure 7:
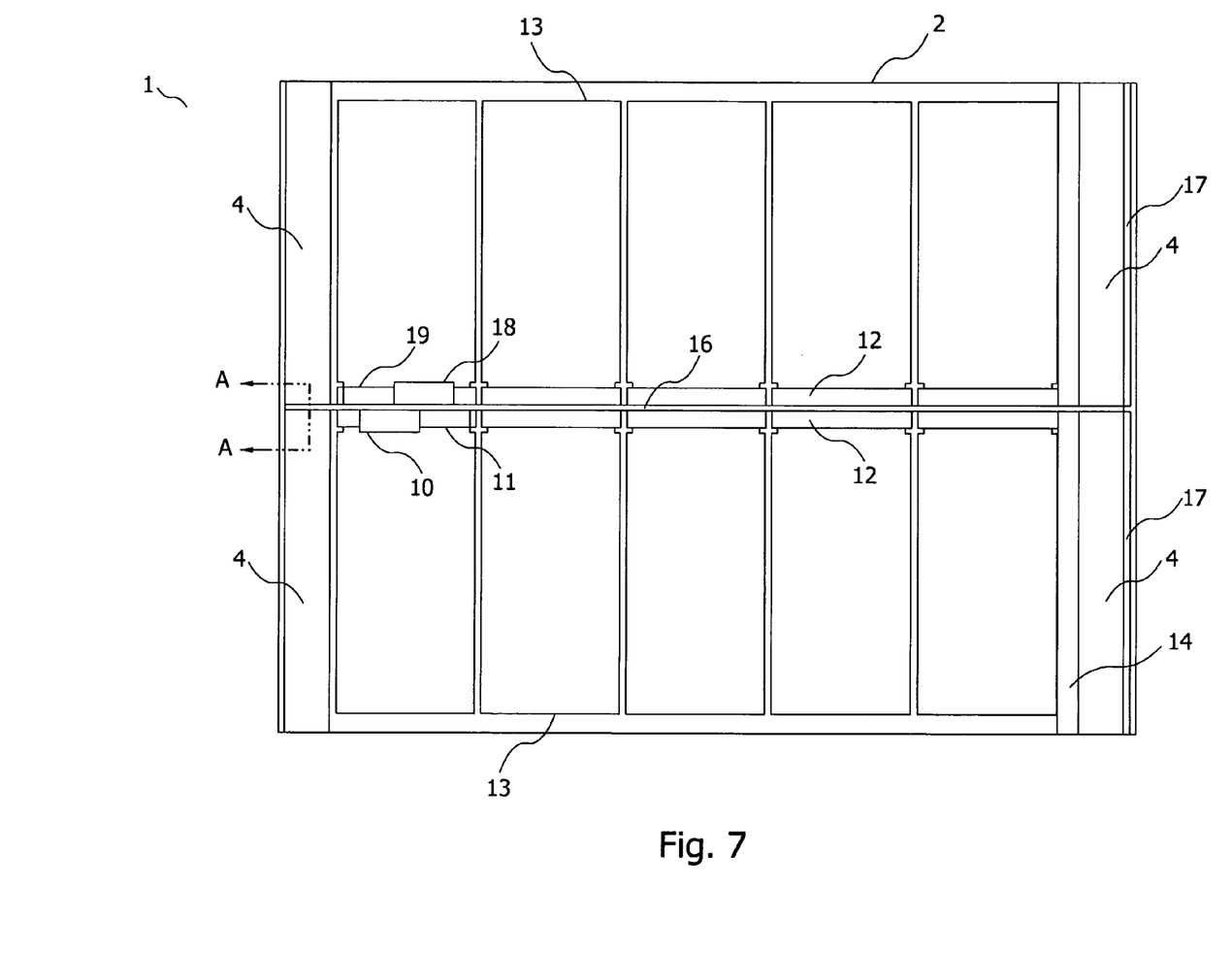
FIG. 7 is a simplified top view of an embodiment of a modular electronic enclosure having a multiple-core back plane and showing two rows of five electronic modules installed in the enclosure.

In an alternate embodiment, a length of the modular enclosure 1 is increased to enable the enclosure to contain up to twenty single-width 4 HP electronic modules. A simplified top view of the alternate embodiment is shown in FIG. 7. In comparison to the embodiment of FIG. 6, the embodiment of FIG. 7 has a multiple-core backplane 16 having at least two cores and electronic modules 13 may be installed from both the front and back sides of the modular electronic enclosure 1. In the embodiment shown in FIG. 7, a first set of power connectors (10, 11), mating connectors for an edge connector 12, and other connectors are installed on a first side of a multiple-core backplane 16. A second set of power connectors (18, 19) and mating connectors for an edge connector 12 are installed on a second side of multiple-core backplane 16. The multiple-core backplane 16 has a thickness chosen to provide a sufficient number of layers for the number of interconnections to be made. In an alternate embodiment, the third power connector 18 and the fourth power connector 19 are replaced by mating connectors for an edge connector 12, thereby removing a position for a second Power Unit and increasing capacity for other types of AdvancedMCs. In other embodiments, the order and arrangement of power connectors and mating connectors for an edge connector is changed to permit other arrangements of AdvancedMCs, electronic modules, cooling units, and MCH.

Figure 8:
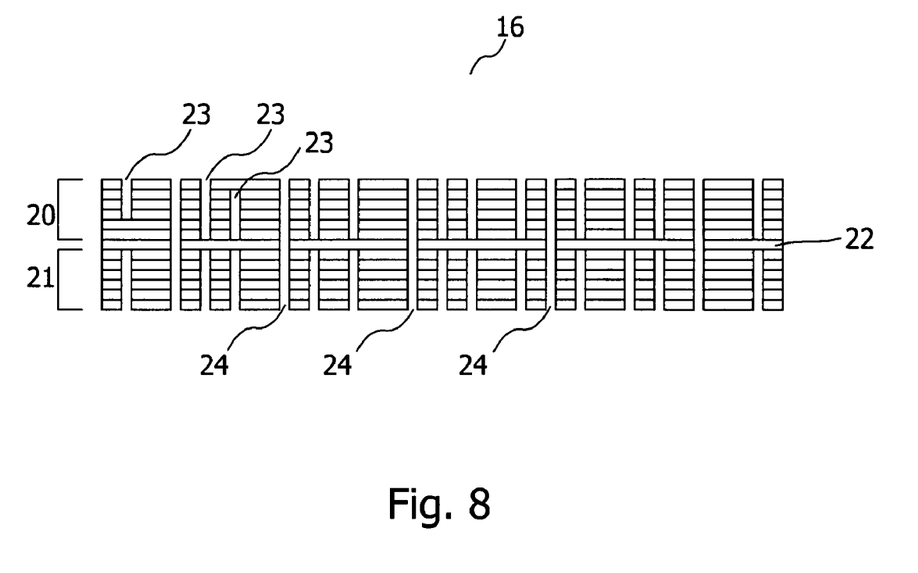
FIG. 8 is a partial enlarged sectional view of an example of a backplane having two cores. The viewing direction for FIG. 8 is shown by the line marked A-A in FIG. 7.

An enlarged sectional view of the multiple-core backplane 16 from FIG. 7 is shown in FIG. 8. FIG. 8 shows an example of the layers and vias comprising a multilayer printed circuit board having two cores. Some layers are insulating layers and some layers contain electrical conductors. The multilayer printed circuit board is divided into two portions, a first core 20 and a second core 21, separated by an insulating layer 22. In other embodiments, the multiple-core backplane 16 may have more than two cores.

Electrical connections are made between electrical conductors on separate layers by metallic-plated holes called vias. As shown in the example of FIG. 8, some vias 24 penetrate all layers of the printed circuit board and are selectively connected to individual layers by joining the metallic plating in the via to a metallic electrical conductor in the circuit layer. Other vias, known as blind vias 23, do not penetrate all layers of the printed circuit board. Blind vias 23 may be selectively connected electrically to individual layers. A multiple-core backplane 16 requires the use of both regular vias 24 and blind vias 23 to form electrical connections between passive and active components and connectors on both sides of the backplane.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, or use of equivalent functional steps for steps described herein. Such insubstantial variations are to be considered within the scope of what is contemplated here. Moreover, if plural examples are given for specific means, or steps, and extrapolation between or beyond such given examples is obvious in view of the present disclosure, then the disclosure is to be deemed as effectively disclosing and thus covering at least such extrapolations.

Unless expressly stated otherwise herein, ordinary terms have their corresponding ordinary meanings within the respective contexts of their presentations, and ordinary terms of art have their corresponding regular meanings.

What is claimed is:

1. A modular electronic enclosure, comprising:
   a chassis comprising a front side, a left side, and a right side, wherein said chassis is adapted for attachment to a nineteen-inch equipment rack;
   a backplane comprising:
      a first side, a top edge of said first side, a bottom edge of said first side, and a second side opposite said first side;
      a plurality of electrical connectors for connection of AdvancedMCs, said plurality of electrical connectors for connection of Advanced MCs attached to said first side of said backplane with a longest dimension of each of said connectors for connection of AdvancedMCs parallel to said top edge of said backplane, and with said plurality of electrical connectors for connection of AdvancedMCs positioned for connection of two rows of AdvancedMCs inserted through said front side of said chassis, one row above another, with each row having electrical connectors for connection of at least three AdvancedMCs;

a first power connector attached to said first side of said backplane and positioned for connection of an AdvancedMC (AMC) power unit inserted through said front side of said chassis;

an attachment location on said first side of said backplane for a first hot-swappable cooling unit inserted through said front side of said chassis and connected to said backplane;

an attachment location on said first side of said backplane for a second hot-swappable cooling unit inserted through said front side of said chassis and connected to said backplane; and an attachment location on said first side of said backplane for a MicroTCA Carrier Hub (MCH) inserted through said front side of said chassis and connected to said backplane;

a backplane structural support extending from said chassis left side to said chassis right side, comprising:

a left end adapted for attachment to said chassis left side;

a right end adapted for attachment to said chassis right side;

an upper flange extending from said left end of said backplane structural support to said right end of said backplane structural support, comprising a first surface for contacting said backplane first side;

a lower flange extending from said left end of said backplane structural support to said right end of said backplane structural support, comprising a second surface for contacting said backplane first side, said second surface on said lower flange coplanar with said first surface on said upper flange, said upper and lower flanges comprise opposite sides of a channel formed into said backplane structural support, and said backplane fitting slidably in said channel between said upper and lower flanges with said first side of said backplane parallel to said front side of said chassis;

a backplane clamp movably disposed between said upper flange and said lower flange;

a first threaded fastener engaged with a threaded hole formed in said upper flange and pressing downward against said movable backplane clamp;

a second threaded fastener engaged with a threaded hole formed in said lower flange and pressing upward against said movable backplane clamp, wherein, when tightened, said first and second threaded fasteners urge said movable backplane clamp toward said front side of said chassis, thereby placing said movable backplane clamp into firm contact with said second side of said backplane and placing said first side of said backplane in firm contact with said first and second surfaces on said upper and lower flanges, thereby holding said first surface of said backplane in a fixed position relative to said front side of said chassis, independent of a thickness dimension of said backplane; and a maximum height dimension of 1 U.

2. The modular electronic enclosure as in claim 1, further comprising:

a chassis cover removably attached to a top side of said chassis;

a chassis bottom removably attached to a bottom side of said chassis;

a first hot-swappable cooling units removably attached to said chassis along said chassis left side and to said backplane; and a second hot-swappable cooling units removably attached to said chassis along said chassis right side and to said backplane.

3. The modular electronic enclosure as in claim 1, wherein said backplane has more than one core.

4. The modular electronic enclosure as in claim 1, further comprising:

an additional plurality of electrical connectors for connection of AdvancedMCs, said additional plurality of electrical connectors for connection of AdvancedMCs attached to said second side of said backplane with a longest dimension of each of said connectors for connection of AdvancedMCs parallel to said top edge of said backplane, and with said additional plurality of electrical connectors for connection of AdvancedMCs positioned for connection of two rows of AdvancedMCs inserted through said back side of said chassis, one row above another, with each row having electrical connectors for connection of at least three AdvancedMCs;

an attachment location on said second side of said backplane for a second AdvancedMC power unit inserted through said back side of said chassis and connected to said backplane;

an attachment location on said second side of said backplane for a third hot-swappable cooling unit inserted through said back side of said chassis and connected to said backplane; and an attachment location on said second side of said backplane for a fourth hot-swappable cooling unit inserted through said back side of said chassis and connected to said backplane.

5. The modular electronic enclosure as in claim 2, further comprising a combined card guide comprising a vertical support, an upper support surface on a top edge of said vertical support, a lower support surface on a bottom edge of said vertical support, a first horizontal card support channel formed in said vertical support, and a second horizontal card support channel formed in said vertical support, wherein a height of said combined support guide corresponds to a vertical separation distance between a surface of said chassis cover and a surface of said chassis bottom, a width of said first horizontal card channel and said second horizontal card support channel is adapted for a sliding fit of an AMC, a vertical separation distance between said first horizontal card channel and said second horizontal card channel is adapted to a preferred separation distance for two single-height electronic modules, said combined card guide upper support surface is removably attached to said chassis cover, and said combined card guide lower support surface is removably attached to said chassis bottom.

6. The modular electronic enclosure as in claim 5, further comprising additional plurality of said combined card guide.

7. The modular electronic enclosure as in claim 5, wherein at least two of said combined card guide are separated from each other by a distance adapted to receive a double-width electronic module.

8. The modular electronic enclosure as in claim 5, wherein at least two of said combined card guide are separated from each other by a distance adapted to receive a quad-width electronic module.

9. The modular electronic enclosure as in claim 6, further comprising at least one electrical connector attached to said backplane that is compatible for connection to electronic modules which are not AdvancedMCs.

10. A modular electronic enclosure, comprising:

a chassis having a back side and a front side, wherein said chassis is adapted for attachment to a nineteen-inch equipment rack, said chassis comprising a backplane structural support, said backplane structural support further comprising a backplane clamp, wherein said backplane clamp is adapted for a slidable fit in an aperture formed along a long axis of said backplane structural support;

a backplane comprising more than one core, a first surface, and a second surface, wherein said backplane is attached to said chassis, a surface of said backplane clamp contacts a surface of said backplane, an adjustment of said backplane clamp adjusts a position of said backplane, said backplane and said chassis are adapted to receive a first and a second mid-size single-width electronic module in a horizontal orientation with said first electronic module positioned above said second electronic module, said first and second electronic modules are AdvancedMCs, and when installed in said chassis, said first and second electronic modules attach to said backplane, said backplane and said chassis include mounting locations for installing and operating at least eight AdvancedMCs, at least two cooling units, and a MicroTCA Carrier Hub (MCH), said backplane is adapted to connect to up to eight of said AdvancedMCs in two rows of four AdvancedMCs each, at least two of said cooling unit, and an MCH, coupled to said backplane through a front side of said chassis, up to an additional ten of said AdvancedMCs in two rows of five AdvancedMCs each and an additional two of said cooling unit, coupled to said backplane through a back side of said chassis;

a chassis cover removably attached to a top side of said chassis;

a chassis bottom removably attached to a bottom side of said chassis;

two hot-swappable cooling units removably attached to said chassis and to said first side of said backplane;

an additional two hot-swappable cooling units removably attached to said chassis and to said second side of said backplane;

a plurality of a combined card guide, each of said combined card guide comprising a vertical support, an upper support surface on a top edge of said vertical support, a lower support surface on a bottom edge of said vertical support, a first horizontal card support channel formed in said vertical support, and a second horizontal card support channel formed in said vertical support, wherein a height of said combined support guide corresponds to a vertical separation distance between a surface of said chassis cover and a surface of said chassis bottom, a width of said first horizontal card channel and said second horizontal card support channel is adapted for a sliding fit of an AdvancedMC, a vertical separation distance between said first horizontal card channel and said second horizontal card channel is adapted to a preferred separation distance for two single-height electronic modules, said combined card guide upper support surface is removably attached to said chassis cover, said combined card guide lower support surface is removably attached to said chassis bottom, and at least two of said combined card guide are separated from each other by a distance adapted to receive a double-width electronic module;

a plurality of electrical connectors compatible with AdvancedMCs attached to said first surface of said backplane and an additional plurality of said electrical connectors compatible with an Advanced MC attached to said second surface of said backplane;

a first power connector, said first power connector attached to said first surface of said backplane, wherein said first power connector is a mating connector for a corresponding connector on a power unit electronic module;

a second power connector, said second power connector attached to said second surface of said backplane, wherein said second power connector is a mating connector for a corresponding connector on a power unit electronic module;

a plurality of non-AdvancedMC electrical connectors attached to said backplane, wherein said non-AdvancedMC electrical connectors are compatible for connection to electronic modules which are not AdvancedMCs;

a mating connector for a MicroTCA Carrier Hub (MCH) attached to said backplane; and a maximum height dimension of 1 U.

11. The modular electronic enclosure as in claim 10, wherein at least two of said combined card guide are separated by a distance corresponding to a width of a double-width electronic module.

12. The modular electronic enclosure as in claim 10, further comprising an Advanced Mezzanine Card.

13. The modular electronic enclosure as in claim 11, wherein at least two of said combined card guide are separated by a distance corresponding to a width of a quad-width electronic module.

14. The modular electronic enclosure as in claim 12, further comprising:

an MCH electronic module; and an MCH plug connector attached to said backplane and connected to said MCH electronic module.

15. The modular electronic enclosure as in claim 14, further comprising an AMC Power Unit electronic module.

16. The modular electronic enclosure as in claim 15, further comprising a J-TAG Switch electronic module.

* * * * *